United States Patent [19]

Ben-Efraim

[11] Patent Number: 5,239,271
[45] Date of Patent: Aug. 24, 1993

[54] MICROWAVE SYNTHESIZER

[76] Inventor: Gideon Ben-Efraim, 10891 Santa Teresa Dr., Cupertino, Calif. 95014

[21] Appl. No.: 786,283

[22] Filed: Nov. 1, 1991

[51] Int. Cl.$^5$ ............................................. H03B 19/00
[52] U.S. Cl. ...................................... 328/14; 307/529
[58] Field of Search ................. 331/4, 2, 1 A; 328/14, 328/15, 16; 307/529

[56] References Cited

U.S. PATENT DOCUMENTS

| 4,130,808 | 12/1978 | Marzalek | 331/4 |
|---|---|---|---|
| 4,614,917 | 9/1986 | Zelitzki et al. | 331/1 A |
| 4,839,603 | 6/1989 | Mower et al. | |
| 4,862,106 | 8/1989 | Toda et al. | 331/2 |
| 5,015,971 | 5/1991 | Taylor et al. | 331/16 |
| 5,053,722 | 10/1991 | Kuo et al. | 331/25 |

OTHER PUBLICATIONS

"SP8853A/B 1.3/1.5 GHz Professional Synthesizer," *Plessey* Semiconductors Limited, Publication No. PS2352, pp. 1–13, Jun. 1990.
"Low-Noise Signal Aids Commercial Radios," by Gideon Ben-Efraim, MSN & CT, pp. 67–77, Jun. 1987.
"Efficient Comb Generator Sampler Locks DR) to 100 MHz Input," by Kutl Josefsberg, Microwave Journ., pp. 303–305, May 1991.
"40-GHz Frequency Converter Heads," by Mohamed M. Sayed, Hewlett-Packard Journ., pp. 14–19, Apr. 1990.
"50-GHz Sampler-Hybrid," by Whiteley et al., IEEE MIT-S Digest, pp. 895–898, 1991.
Product brochure entitled "Sampling Phase Detector," by Metelics Corporation.

*Primary Examiner*—Jin F. Ng
*Assistant Examiner*—Sinh Tran
*Attorney, Agent, or Firm*—Majestic, Parsons, Siebert & Hsue

[57] ABSTRACT

A millimeter wave synthesizer is described which comprises a Gunn oscillator mechanically tuned so that its bandwidth includes the selected harmonic of the output of an L-band synthesizer. The output of the synthesizer and the Gunn oscillator are applied to a sampling phase detector. If the frequency of the output of the oscillator is exactly the same as the harmonic selected, the detector will provide a DC signal. If the frequency of the oscillator output is different from that of the selected harmonic, the detector will provide a AC signal. A loop filter and search circuit respond to this AC signal to provide a sawtooth signal fed to the oscillator in an automatic search process causing the frequency of the oscillator output to be adjusted until it is locked to the selected harmonic of the synthesizer. The output of the synthesizer can be tuned remotely to compensate for temperature and aging effects.

12 Claims, 3 Drawing Sheets

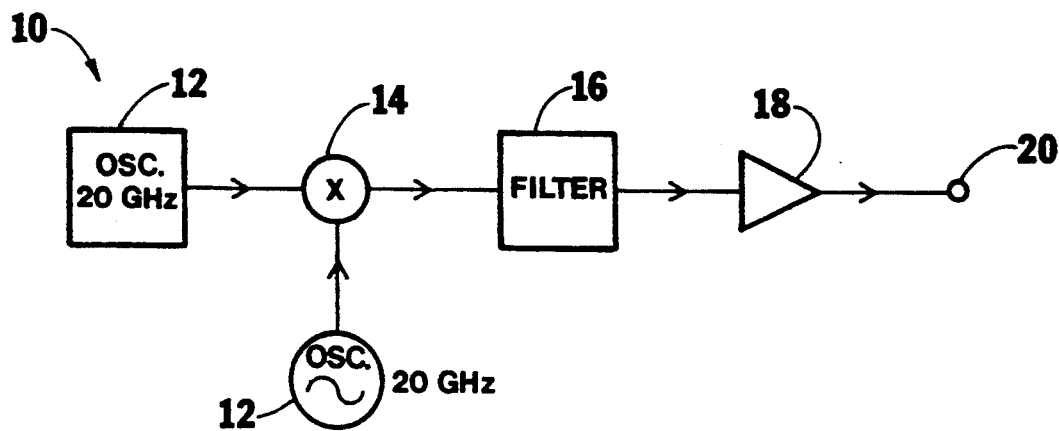
PRIOR ART
FIG._1a.
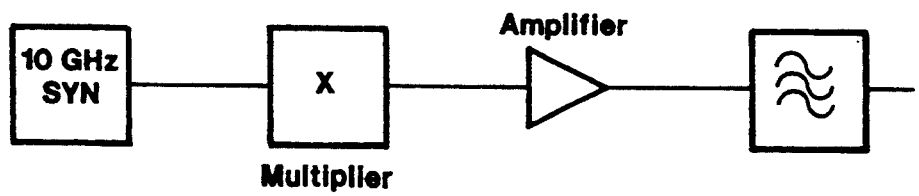
OTHER PRIOR ART (OPTION)
FIG._1b.

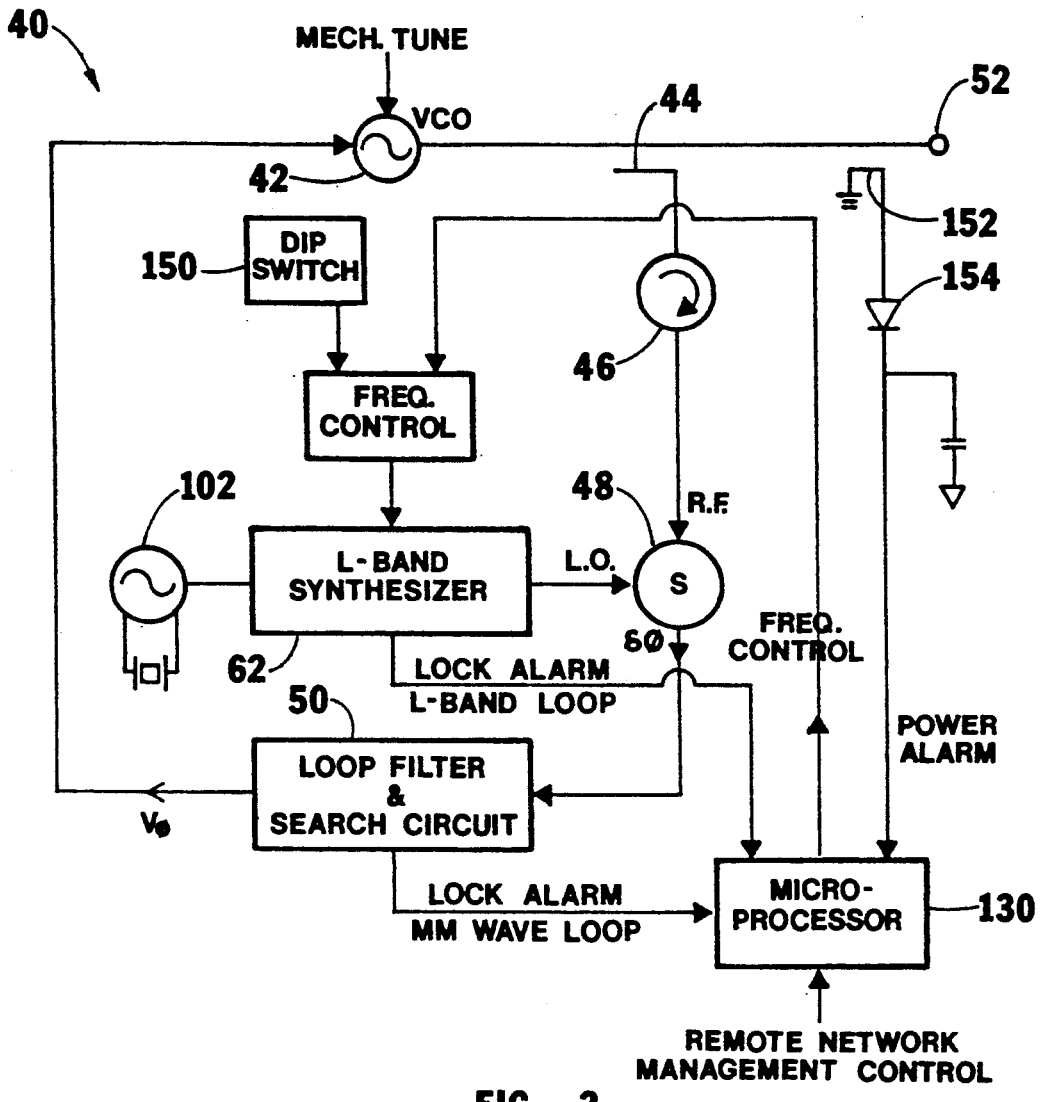
FIG._2.
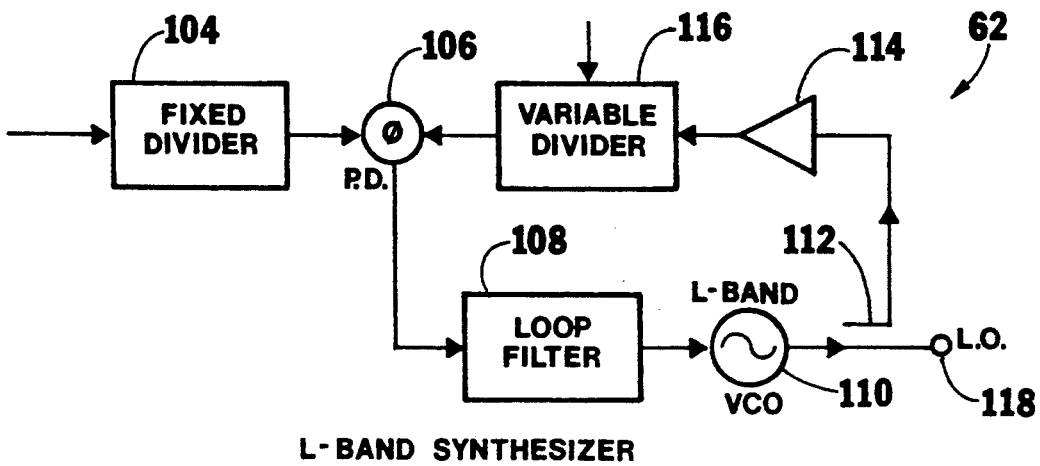
L-BAND SYNTHESIZER
FIG._3.

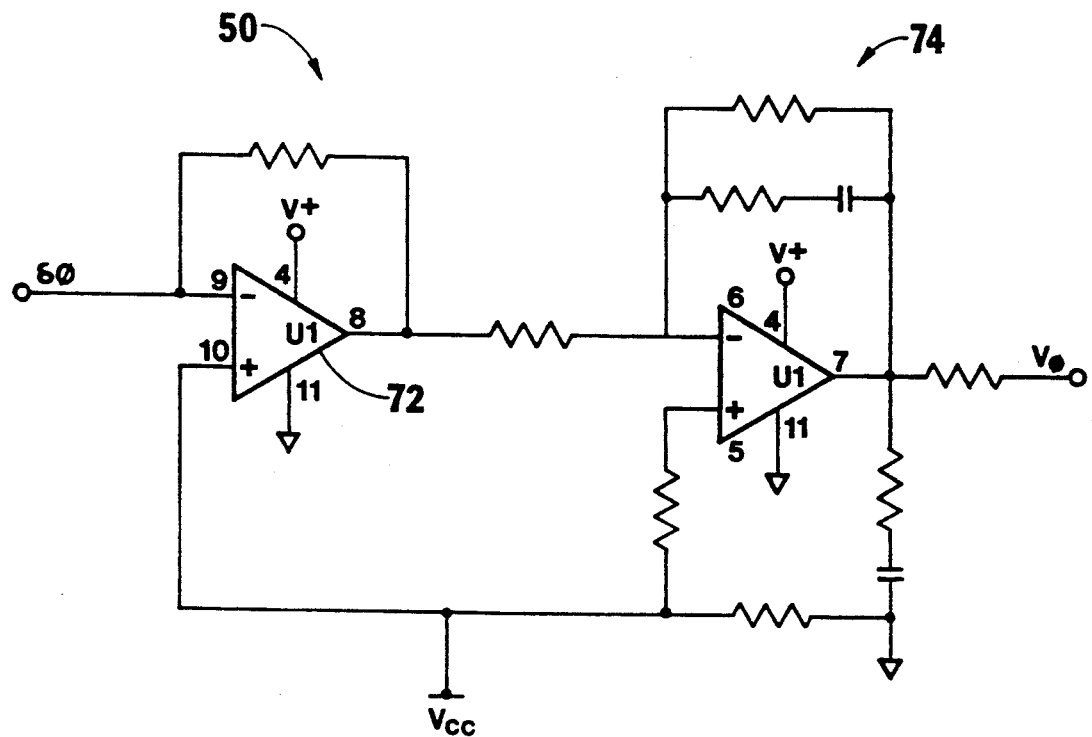
FIG._4.
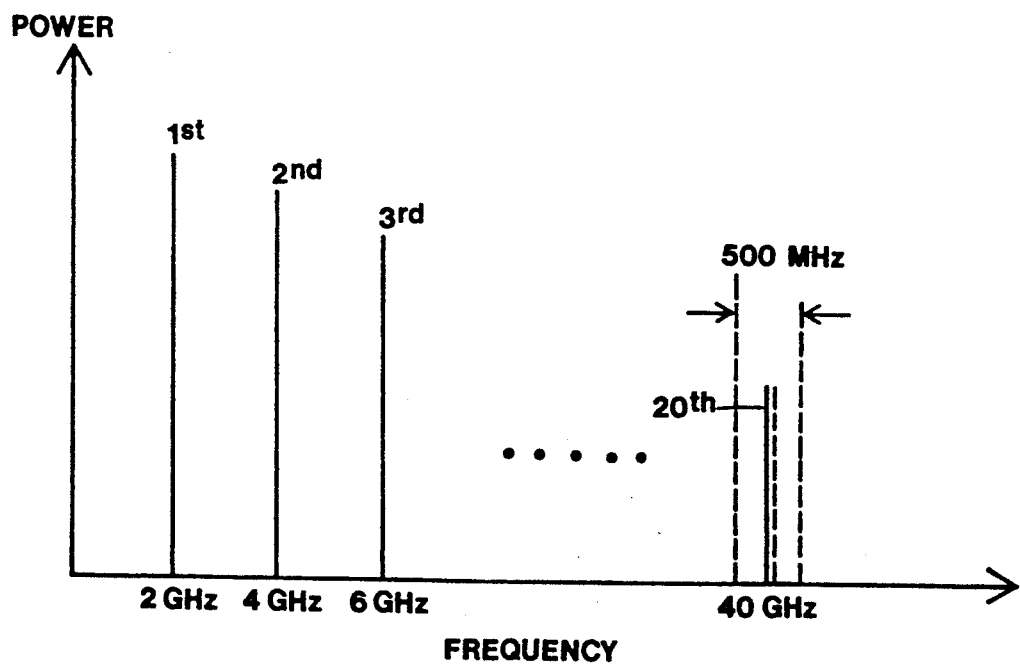
FIG._5.

MICROWAVE SYNTHESIZER

BACKGROUND OF THE INVENTION

This invention relates in general to microwave synthesizers and in particular, to a synthesizer capable of providing adjustable of high fundamental frequencies, such as millimeter waves. Conventional synthesizers typically include a phase-locked loop which comprises a voltage controlled oscillator, a mixer, a phase detector, and a low pass filter in the loop. An external reference frequency is applied to the phase detector so that deviations of the voltage controller oscillator (VCO) from the reference frequency cause the phase detector to generate an error voltage which when applied to the VCO, adjusts the VCO frequency to match the reference frequency.

Some frequency synthesizer systems proposed include multiple-loop phase-locked loops, such as that disclosed by Mower et al. in U.S. Pat. No. 4,839,603. The multiple-loop system of Mower et al. includes an upper loop which is similar to that of conventional single loop frequency synthesizers described above as well as a lower loop for generating the reference frequency. Mower et al. employs a frequency multiplier and a mixer coupling the outputs of the upper and lower loops in order to extend the frequency range of the outputs of the synthesizer to about 20 GHz.

As known to those skilled in the art, frequency synthesizers of medium output power (up to 30 dbm) for providing millimeter waves (defined as microwave of frequencies above about 26 GHz) are difficult to make and are expensive, especially if additional amplifiers are required. This type of medium power millimeter wave synthesizers are useful, for example, as local oscillators in short haul millimeter wave links. Solutions proposed up to now frequently require expensive components such as amplifiers capable of amplifying millimeter wave frequencies. It is therefore desirable to provide improved frequency synthesizer designs capable of providing high frequency microwaves at reasonable cost. It is also desirable to provide improved frequency synthesizer designs which are simpler and less expensive than conventional designs, even at frequencies below those of millimeter waves.

SUMMARY OF THE INVENTION

It is a principal object of the present invention to provide a novel synthesized fundamental frequency source for generating frequency up to 60 GHz.

It is another principal object of the present invention to provide a synthesizer millimeter wave frequency source having a microprocessor or switch control frequency steps of about 3.5 Mhz (with 1.75 Mhz, 7 Mhz, 14 Mhz and 28 Mhz as options).

It is another principal object of the present invention to provide a high stability millimeter wave synthesizer having a relatively low frequency stable source for its base frequency.

It is a principal object of the present invention to provide a novel sampling phase detector for utilization in the output loop.

It is another principal object of the present invention to use a fundamental Gunn oscillator that will provide fundamental output frequency and enough output power to drive the antenna and as local oscillator for the down conversion in milimeter wave radio configuration.

It is another principal object to provide a synthesizer that is economical, lightweight, low cost, robust, highly integrated packaging and with high reliability.

According to these and other objectives of the present invention there is provided a frequency synthesizer comprising a multi-phase loop system.

The synthesizer device of this invention comprises a voltage controlled oscillator having an output and a L-band synthesizer having an output whose frequency is tunable in response to a frequency control signal, and a phase detector responsive to the output of the oscillator and the output of the synthesizer to derive a first DC voltage or an AC signal defining a beat note. The device also includes means responsive to said beat note for deriving a search signal and to said first DC voltage for deriving a second DC voltage proportional to the phase difference between the output of the oscillator and the output of the synthesizer. The search signal or the second DC voltage are applied to the oscillator to alter its output. The oscillator has a bandwidth and is tunable so that its bandwidth includes a selected harmonic of the output of the second oscillator.

The method of this invention provides a stable microwave signal using (a) a voltage controlled oscillator having an output and (b) a L-band synthesizer having an output whose frequency is tunable in response to a frequency control signal. The oscillator has a bandwidth and is tunable so that its bandwidth includes a harmonic of the output of the L-band synthesizer. The method comprises tuning the oscillator so that its bandwidth includes a desired harmonic of the frequency of the output of the synthesizer, detecting the outputs of the oscillator of the L-band synthesizer to derive a beat note or a first DC voltage. The method further comprises deriving a search signal in response to said beat note and a second DC voltage in response to said first DC voltage. The second DC voltage is proportional to the phase difference between the output of the oscillator and of the L-band synthesizer. The method further comprises applying the search signal or the second DC voltage to the oscillator to alter its output.

BRIEF DESCRIPTION OF THE DRAWINGS

FIGS. 1a and 1b are block diagrams of conventional synthesizers for providing millimeter waves.

FIG. 2 is a block diagram of a synthesizer to illustrate the preferred embodiment of the invention.

FIG. 3 is a block diagram of the L-band synthesizer of FIG. 2.

FIG. 4 is a schematic circuit diagram of the loop filter and search circuit of FIG. 2.

FIG. 5 is a graphical illustration of the harmonics in the frequency domain generated by the step recovery diode in the sampling phase detector of FIG. 2 in response to the local oscillator signal from the L-band synthesizer, and of the frequency band of the voltage controlled oscillator of FIG. 2 superimposed onto one of the harmonics to illustrate the operation of the invention.

DETAILED DESCRIPTION OF THE PREFERRED EMBODIMENT

FIG. 1a is a block diagram of a conventional frequency synthesizer for providing millimeter waves. As shown in FIG. 1a, a conventional millimeter wave synthesizer 10 includes two oscillators or synthesizers 12 each capable of providing microwave signals at 20 GHz. The outputs of the two oscillators are applied to a mixer 14 and the difference signal is filtered out by filter 16 to provide only the sum signal at 40 GHz. The sum signal is then amplified by means of amplifier 18 to provide a 40 GHz output at node 20. While simple, the above-described design in FIG. 1a is expensive since the amplifier 18 must be capable of handling high frequencies such as 40 GHz. FIG. 1b shows another conventional millimeter wave synthesizer with disadvantages similar to that of FIG. 1a. Other conventional frequency synthesizers, including the one proposed by Mower et al. described above, are not capable of providing millimeter waves. With the tremendous growth in telecommunications and other applications for microwaves, it is desirable to be able to generate stable signals in the millimeter wave frequency range, such as for use as local oscillators in short haul millimeter wave links. It is therefore desirable to provide a frequency synthesizer that is cheaper and better than that of FIG. 1.

FIG. 2 is a block diagram of a frequency synthesizer capable of providing millimeter waves to illustrate the preferred embodiment of this invention. While the design of the frequency synthesizer of FIG. 2 is particularly useful for providing millimeter waves, it will be understood, however, that the frequency synthesizer of FIG. 2 may be used to provide microwaves with frequencies outside the millimeter wave range as well; all such applications are within the scope of the invention.

As shown in FIG. 2, synthesizer 40 includes a phase-locked loop composed of a voltage controlled oscillator 42, a coupler 44, an isolator 46, a sampling phase detector 48, and a loop filter and search circuit 50. Several different conventional oscillators may be used for oscillator 42. In the preferred embodiment, oscillator 42 is a voltage control Gunn oscillator. It may be mechanically tuned as indicated in FIG. 2 to a center frequency in the oscillator frequency band which is usually about 200 to 500 MHz in width. Thereafter, the frequency of the Gunn oscillator may be voltage tuned to cover the predetermined frequency band. Oscillator 42 may also be a voltage tuned dielectric resonator Gunn oscillator where the stability of the oscillator and the Q is determined by a ceramic based dielectric material usually used in Dielectric Resonator Oscillator known as DRO. Oscillator 42 may also be a GaAs FET voltage control oscillator using a GaAs FET as active device in connection with varactor tuned device to generate the oscillation and to adjust the oscillation with the varactor. The output of the oscillator 42 drives an antenna port 52 and is coupled to the sampling phase detector 48 through a coupler 44 and an isolator 46.

Sampling phase detector 48 has a RF input and a Local Oscillator (LO) input and a phase detector ($\delta\phi$) output. The local oscillator reference signal applied to the input of detector 48 originates from L-band synthesizer 62. The output of the detector 48 is applied to the loop filter and search filter circuit 50 which derives a signal $V_\phi$ which is in turn applied to the oscillator 42, to enable the frequency of the output of oscillator 42 to lock onto a harmonic of the local oscillator signal from synthesizer 62.

Synthesizer 62 supplies a reference signal with fundamental frequency in the 0.5 to 4 GHz range. In order for oscillator 42 to provide microwave frequencies in a millimeter wave range, detector 48 causes the output of oscillator 42 to be locked onto an appropriate harmonic of the fundamental frequency of the local oscillator signal from synthesizer 62. In this manner, synthesizer 62 may be a low base frequency reference signal generator embodied in a L-band synthesizer. Eventhough the reference source 62 has a low base frequency, the synthesizer 40 is yet capable of providing millimeter waves, while at the same time avoiding the use of the expensive amplifiers such as amplifier 18 of FIG. 1a.

For providing microwaves at fundamental frequencies below 23 GHz, the sampling phase detector 48 may be one provided by Metelics Corporation, as described by its product brochure entitled "Sampling Phase Detector," a copy of which is attached herewith and incorporated herein in its entirety by reference. As described in the attached product brochure from Metelics Corporation, the sampling phase detector 48 includes a step recovery diode which generates a comb of harmonic frequencies reference to the reference frequency input from the synthesizer 62. If the RF input and the selected harmonic of the LO input of detector 48 have different frequencies, then the $\delta\phi$ output of the detector is a beat note defined as an AC signal whose frequency is given by the difference in frequency between the input signal RF and the selected harmonic of the LO input. If, however, the frequencies of the input signal RF and the harmonic of input signal LO are equal, then the output of the detector 48 will be a DC voltage whose magnitude is proportional to the phase difference between the two input signals.

In addition to the above-described Metelics sampling phase detector, for frequencies above 26 GHz, the 40 GHz frequency sampler in FIG. 5 of an article "40-*GHz Frequency Converter Heads,*" by Sayed, *Hewlett-Packard Journal,* pp. 14-19, April 1980, may also be used for phase detector 48. For such high frequencies, another similar design that may be used for detector 48 is the sampler described in the article "50 GHz Sampler Hybrid Utilizing a Small Shockline and an Internal SRD," by Whiteley et al., 1991 IEEE MTT-S Digest, pp. 895-898.

Thus, in reference to section "The Frequency Domain Performance" of the brochure from Metelics Corporation and the accompanying figure on page 4 of the brochure, it is possible to first mechanically tune the bandwidth of oscillator 42 so that the bandwidth overlaps one of the harmonics of the step recovery diode of phase detector 48. As shown in the Metelics brochure, the step recovery diode would generate a comb of harmonic frequencies referenced to the local oscillator signal from synthesizer 62. Assume, for example, that the synthesizer 62 provides a local oscillator signal of 1 GHz to detector 48, the step recovery diode of detector 48 will provide a comb of frequencies with harmonics referenced to the 1 GHz fundamental frequency. Therefore, in order for synthesizer 42 to provide a millimeter wave of 25 GHz, oscillator 42 is first tuned so that its bandwidth overlaps the twenty-fifth harmonic generated by the step recovery diode at 40 GHz. Detector 48 then generates either a beat note or a DC voltage, depending upon whether the oscillator output 42 and the twenty-fifth harmonic of the local oscillator signal have exactly the same frequency or not.

FIG. 4 is a schematic circuit diagram of loop filter and search circuit 50. In reference to FIG. 4, the output of detector 48 is applied first to an amplifier 72 and the amplified signal is then passed through a loop filter 74. If the output of detector 48 $\delta\phi$ is a DC signal, the output of amplifier 72 and loop filter 74 would also be a DC signal $V_\phi$ which is proportional to the phase difference between the inputs RF and the selected harmonic of the local oscillator signal from synthesizer 62. If, however, output δφ of detector 48 is an AC signal, after being amplified by amplifier 72, loop filter 74 generates a sawtooth-shaped signal. This signal is applied to oscillator 42. As the amplitude of $V_\phi$ rises, the output of oscillator 42 increases in frequency.

Since the output of detector 48 is an AC signal or a beat note, this means that the output of oscillator 42 and the selected harmonic of the local oscillator signal LO from synthesizer 62 are not at exactly the same frequency. As the amplitude of $V_\phi$ rises, the output of oscillator 42 also rises in frequency. Starting out, if the output of oscillator 42 is at a lower frequency compared to the harmonic selected, at a certain point the rising frequency of the output 42 will be equal to that of the harmonic; at this point, the output of detector 48 will become a DC signal, instead of a beat note. Loop filter and search circuit 50 respond to this change and applies a DC signal to oscillator 42, so that the frequency of the oscillator output no longer changes. In this manner, the frequency of the output of oscillator 42 is locked to that of the selected harmonic of the L-band synthesizer, by means of phase detector 48 and loop filter and search circuit 50. If starting out, the frequency of the oscillator 42 output is at a higher frequency compared to that of the selected harmonic, this merely means that the sawtooth output of loop filter 50 will need to fall first before rising again to become equal to the frequency of the harmonic.

Due to temperature effects and component aging, the output of oscillator 42 may shift. However, the phase locked loop including oscillator 42, phase detector 48, loop filter and search circuit 50 and L-band synthesizer 62 will ensure that the selected harmonic selected falls within the bandwidth of oscillator 42 and will be able to keep locking the Gunn oscillator 42 to the selected harmonic of the LO input. FIG. 3 is a block diagram illustrating in more detail the construction of synthesizer 62. In reference to FIGS. 2 and 3, a reference oscillator 102 supplies a reference signal to the fixed divider circuit 104 of synthesizer 62. The output of divider 104 is applied to phase and frequency detector 106 within a loop which includes a loop filter 108, an L-band voltage controlled oscillator 110, coupler 112, amplifier 114, and variable divider 116. Phase detector 106 generates an error signal in response to the output of dividers 104, 116. This error signal is filtered by 108 and then applied to oscillator 110. The output of oscillator 110 is the output of the synthesizer 62. The output of the oscillator 110 is also coupled through amplifier 114 and variable divider 116 to phase detector 106 in order to derive the error signal. The above-described phase-locked loop causes the output of oscillator 110 to be locked to a frequency bearing a predetermined ratio to the frequency of oscillator 102 in FIG. 2. Thus in order to change the local oscillator signal output appearing at node 118 of FIG. 3, one only needs to change divider ratio in divider 116. This may be accomplished remotely by frequency control signal from microprocessor 130 in FIG. 2. As shown in FIG. 2, microprocessor 130 may apply a frequency control signal which is stored in frequency control latch 132 in FIG. 2. This signal is then applied to the variable divider 116 of synthesizer 62 in order to alter the local oscillator output at 118.

The operation of the locking and the tuning of synthesizer 62 are illustrated in FIG. 5. FIG. 5 is a graphical illustration in a frequency domain of the harmonics generated by sampling phase detector 48 in response to the local oscillator input from synthesizer 62. In FIG. 5, it is assumed that synthesizer 62 generates a local oscillator output at note 118 whose fundamental frequency is 2 GHz. Therefore, the first, second, third, ... up to the twentieth harmonic are at 2, 4, 6, ..., 40 GHz respectively, all as shown in FIG. 5. Initially, Gunn oscillator 42 is mechanically tuned so that its bandwidth of approximately 500 MHz is centered around the twentieth harmonic at 40 GHz as shown in FIG. 5. Then, as described above, depending upon whether the oscillator 42 output is at exactly 40 GHz, the detector output δφ may be a beat note or a DC signal. As described in detail above, if the output of detector 48 is a beat note, loop filter and search circuit 50 generate a sawtooth signal or a search signal to vary the frequency of the oscillator output until the output of oscillator 42 is exactly at 40 GHz, at which point the output of circuit 50 turns into a DC signal, thereby causing the output of oscillator 42 to be locked at 40 GHz.

Due to temperature effects and aging, the bandwidth of oscillator 42 may not be centered at 40 GHz. In such event, an error correction voltage will be generated by the sampling phase detector 48, thereby causing once again the output signal of the oscillator 42 to be centered at the twentieth harmonic frequency. Obviously, if desired, oscillator 42 may be tuned so that its bandwidth may be centered around a different harmonic in order to provide an output at 52 at a different frequency. With the design of the synthesizer 40 described above, synthesizer 40 is capable of providing a stable output having a fundamental frequency in the range of about 20 to 120 GHz, even though synthesizer 62 provides an output whose fundamental frequency is in the range of about 500 MHz to 4 GHz.

If desired, it is possible to alter the frequency of the output of synthesizer 40 in steps. Thus to alter the output of 52 in steps within the range of 0.5 to 30 MHz, the output of synthesizer 62 is altered in frequency by steps within the range of 10 to 50 KHz. Thus if the output of oscillator 42 is locked onto the twenty-fifth harmonic of the synthesizer output, in order to change the synthesizer output at 52 by steps of 3.5 MHz, the step size of the synthesizer 62 is 140 KHz.

Instead of using a microprocessor 130 to alter the frequency of synthesizer 62, the output frequency of synthesizer 62 may also be changed through a dip switch 150. Preferably, microprocessor 130 also receives the lock alarm L-band loop signal, the lock alarm millimeter wave loop signal from synthesizer 62 and circuit 50 respectively. Microprocessor 130 also receives the power alarm signal through a coupler 152 and diode 154. These alarm signals are used for diagnostic purposes so that the user can keep track of conditions of synthesizer 40.

The invention has been described above by reference to a preferred embodiment. It will be understood, however, that various modifications may be made without departing from the scope of the invention which is to be limited only by the appended claims.

What is claimed is:

1. A microwave synthesizer device comprising:
   a voltage controlled oscillator having an input;
   an L-band synthesizer having an output whose frequency is tunable in response to a frequency control signal;

a phase detector responsive to the outputs of the oscillator and of the L-band synthesizer to derive a first DC voltage or an AC signal defining a beat note; and means responsive to said beat note for deriving a search signal and to said DC voltage for deriving a second DC voltage propertional to the phase difference between the output of the oscillator and the output of the L-band synthesizer, said search signal or said second DC voltage being applied to said oscillator to alter its output, wherein said oscillator has a bandwidth and is tunable so that its bandwidth includes a harmonic of the output of the L-band synthesizer.

2. The synthesizer of claim 1, wherein said oscillator includes a Gunn oscillator.

3. The synthesizer of claim 1, wherein the output of said oscillator has a fundamental frequency in the range of about 20 to 120 GHz.

4. The synthesizer of claim 1, wherein the output of the L-band synthesizer has a frequency in the range of about 0.5 to 4 GHz.

5. The synthesizer of claim 1, wherein when the outputs of the oscillator and of the L-band synthesizer have different frequencies, said phase detector will generate a beat note whose frequency is the difference between the frequencies of the outputs of the oscillator and of the L-band synthesizer.

6. The synthesizer of claim 5, wherein the search signal is a sawtooth-shaped signal, so that when said search signal is applied to the oscillator, and when the search signal rises to a value such that the outputs of the oscillator and of the L-band synthesizer have substantially the same frequency, the phase detector will provide a DC voltage, causing the frequency of the output of the oscillator to lock onto the frequency of the output of the L-band synthesizer or a harmonic thereof.

7. The synthesizer of claim 1, further comprising means for applying the frequency control signal to the L-band synthesizer in order to alter the frequency of the outputs of the oscillator and of the L-band synthesizer in steps.

8. The synthesizer of claim 7, wherein the frequency control signal applied by the applying means is such that the frequency of the output of the L-band synthesizer is altered in steps within a range of 10 to 50 KHz, and the frequency of the output of the oscillator is altered in steps within a range of 0.5 to 30 MHz.

9. A method for providing a stable wave signal using (a) a voltage controlled oscillator having an output, and (b) an L-band synthesizer having an output whose frequency is tunable in response to a frequency control signal, wherein said oscillator has a bandwidth and is tunable so that its bandwidth includes a harmonic of the output of the synthesizer; said method comprising:

tuning the oscillator so that its bandwidth includes a desired harmonic of the frequency of the output of the synthesizer;

detecting the outputs of the oscillator and of the synthesizer to derive a beat note or a first DC voltage;

deriving a search signal in response to said beat note and a second DC voltage in response to said DC voltage, said second DC voltage being proportional to the phase difference between the output of the oscillator and the output of the synthesizer; and applying said search signal or said second DC voltage to said oscillator to alter its output.

10. The method of claim 9, further comprising applying the frequency control signal to the synthesizer to alter the frequency of the output of the oscillator.

11. The method of claim 10, wherein the frequency control signal applied by the applying step is such that the frequency of the output of the synthesizer is altered in steps within a range of 10 to 50 KHz, and the frequency of the output of the oscillator is altered in steps within a range of 0.5 to 30 MHz.

12. The method of claim 9, wherein said desired harmonic having a frequency in a range of about 20 to 120 GHz.

* * * * *

UNITED STATES PATENT AND TRADEMARK OFFICE
CERTIFICATE OF CORRECTION

PATENT NO. : 5,239,271
DATED : AUGUST 24, 1993
INVENTOR(S) : GIDEON BEN-EFRAIM

It is certified that error appears in the above-indentified patent and that said Letters Patent is hereby corrected as shown below:

Column 6, line 65, in Claim 1:   Replace "input" with --output--

Column 7, line 7, in Claim 1:    Replace "propertional" with --proportional--

Signed and Sealed this

Nineteenth Day of April, 1994

Attest:

BRUCE LEHMAN

Attesting Officer          Commissioner of Patents and Trademarks